United States Patent
Stern

(10) Patent No.: US 10,903,621 B2
(45) Date of Patent: Jan. 26, 2021

(54) CIRCUIT FOR DRIVING A LASER AND METHOD THEREFOR

(71) Applicant: ARGO AI, LLC, Pittsburgh, PA (US)

(72) Inventor: Mark C. Stern, Princeton, NJ (US)

(73) Assignee: ARGO AI, LLC, Pittsburgh, PA (US)

( * ) Notice: Subject to any disclaimer, the term of this patent is extended or adjusted under 35 U.S.C. 154(b) by 0 days.

(21) Appl. No.: 16/253,577

(22) Filed: Jan. 22, 2019

(65) Prior Publication Data

US 2019/0229493 A1 Jul. 25, 2019

Related U.S. Application Data

(60) Provisional application No. 62/620,377, filed on Jan. 22, 2018, provisional application No. 62/620,926, filed on Jan. 23, 2018.

(51) Int. Cl.
*H01S 5/042* (2006.01)
*H01S 5/40* (2006.01)
*H01S 5/062* (2006.01)

(52) U.S. Cl.
CPC ........ *H01S 5/0428* (2013.01); *H01S 5/06216* (2013.01); *H01S 5/4018* (2013.01); *H01S 5/4025* (2013.01)

(58) Field of Classification Search
CPC ...... H01S 5/0428; H01S 5/042; H01S 5/0261; H01S 5/06216; H01S 5/06835;
(Continued)

(56) References Cited

U.S. PATENT DOCUMENTS

| 5,287,372 A | 2/1994 | Ortiz |
| 6,697,402 B2 | 2/2004 | Crawford |

(Continued)

FOREIGN PATENT DOCUMENTS

| EP | 3159982 A1 * | 4/2017 | ........... H01S 5/0428 |
| WO | WO-2012070283 A1 * | 5/2012 | ......... H05B 33/0815 |
| WO | 2017/025958 A1 | 2/2017 | |

OTHER PUBLICATIONS

Qing Wang et al., "Design of high-peak current and narrow pulse driver of laser diode", "Science Direct", "The Journal of China Universities of Posts and Telecommunications", Sep. 1, 2009, DOI: 10.1016/S1005-8885(08)60343-X, pp. 82-85, vol. 16(Suppl.).

(Continued)

*Primary Examiner* — Joshua King
(74) *Attorney, Agent, or Firm* — Kaplan Breyer Schwarz, LLP

(57) ABSTRACT

The present disclosure is directed toward circuits for driving one or more laser diodes with a series of current pulses, where the energy required for each current pulse is generated and stored on a pulse-by-pulse basis. Laser-driver circuits in accordance with the present disclosure include a charge-storage inductor that is electrically coupled with a power supply and a charge-storage capacitor that is electrically coupled with a laser-diode string. The electrical coupling between the inductor and capacitor is controlled by one or more switches having on- and off-states that determine whether the inductor is charged by the power supply, charges the capacitor, or whether the charged capacitor generates a current pulse in the laser-diode string. By controlling the states of the switches, the energy provided to the laser-diode string can be controlled on a pulse-by-pulse basis.

15 Claims, 9 Drawing Sheets

(58) Field of Classification Search
CPC ..... H01S 5/4018; H05B 45/32; H05B 45/325;
H05B 45/33; H05B 45/335; H05B 45/00
See application file for complete search history.

(56) References Cited

U.S. PATENT DOCUMENTS

| | | | |
|---|---|---|---|
| 6,980,575 B1 | 12/2005 | Rohilla | |
| 7,262,584 B2 | 8/2007 | Crawford et al. | |
| 8,076,920 B1* | 12/2011 | Melanson | H02M 1/4208 |
| | | | 315/247 |
| 8,760,897 B2* | 6/2014 | Yang | H02M 3/005 |
| | | | 323/266 |
| 9,817,122 B2 | 11/2017 | Metzler et al. | |
| 10,141,716 B1* | 11/2018 | Lenius | G01S 17/32 |
| 10,531,527 B1* | 1/2020 | Milanesi | H05B 45/46 |
| 10,531,535 B2* | 1/2020 | Athalye | H01R 13/6658 |
| 2003/0016711 A1 | 1/2003 | Crawford | |
| 2005/0110474 A1* | 5/2005 | Ortiz | H02M 3/156 |
| | | | 323/282 |
| 2010/0020306 A1* | 1/2010 | Hall | G01S 7/4813 |
| | | | 356/5.01 |
| 2011/0085576 A1* | 4/2011 | Crawford | H05B 33/0818 |
| | | | 372/38.07 |
| 2013/0308668 A1* | 11/2013 | Guskov | H01S 5/0428 |
| | | | 372/38.04 |
| 2014/0009952 A1* | 1/2014 | Nomura | H01S 5/00 |
| | | | 362/509 |
| 2014/0269799 A1* | 9/2014 | Ortiz | H01S 5/0428 |
| | | | 372/38.02 |
| 2017/0085057 A1 | 3/2017 | Barnes et al. | |
| 2018/0188360 A1* | 7/2018 | Berger | G01S 17/42 |

OTHER PUBLICATIONS

Eduard Sackinger et al., "A 15-mW, 155-Mb/s CMOS Burst-Mode Laser Driver with Automatic Power Control and End-of-Life Detection", "IEEE Journal of Solid-State Circuits", Dec. 1, 1999, pp. 1944-1950, vol. 34, No. 12.

* cited by examiner

CIRCUIT FOR DRIVING A LASER AND METHOD THEREFOR

RELATED APPLICATIONS

This application claims the benefit of U.S. Provisional Application No. 62/620,377 filed Jan. 22, 2018 and U.S. Provisional Application No. 62/620,926 filed Jan. 23, 2018, the entire contents of each of which are incorporated by reference as if set forth at length herein. If there are any contradictions or inconsistencies in language between this application and the application that has been incorporated by reference that might affect the interpretation of the claims in this application, the claims in this application should be interpreted to be consistent with the language in this application.

TECHNICAL FIELD

The present disclosure relates to electronics in general, and, more particularly, to circuits for generating short-pulse-width current pulses suitable for driving one or more laser diodes.

BACKGROUND

A pulsed laser-diode driver is used to drive a laser diode with pulses of current to generate an output light signal comprising a series of light pulses in a variety of applications, such as pumping another laser, optical communications, time-of-flight measurement systems, proximity sensing, timed illumination, and the like.

A conventional laser-driver circuit typically comprises a storage capacitor and a pulsed current source, which are connected in series with one or more laser diodes. When the current source is turned on, energy is drawn from the capacitor through the laser diode. As energy is drawn into the laser-diode, the voltage on the capacitor falls. As a result, the current source must have sufficient compliance to continue to operate as this occurs. Typically, a low voltage loss across the current source is desired to realize efficient operation. Unfortunately, this requires the use of a large and bulky capacitor to minimize voltage sag.

Quasi-resonant diode-drive current sources capable of providing high-power pulsed currents are well known in the prior art. Prior-art systems include zero-current switched full-wave quasi-resonant converters operative for providing high-amplitude pulsed-output currents for directly driving light-emitting devices, such as light-emitting diodes (LEDs), pump diodes used in solid-state diode-pumped lasers, and the like.

Although directly driving a diode array is effective, in pulsed applications, the power supply must handle the peak power required by the diode array, despite the fact that the average power required is typically substantially lower. As a result, these systems require complex and expensive components, such as capacitors, transformers, etc.

Furthermore, a laser diode and the electrical traces, cabling, and other components employed to drive it, are characterized by an inductance that can limit the rise time of a drive-current pulse provided to the laser diode. A high driving voltage can be used to improve rise times by overdriving the device; however, this leads to increased power dissipation that gives rise to the need for more bulky and expensive drive components to handle the increased power and voltage requirements.

The need for a simple, low-cost way to drive a plurality of laser diodes with fast, narrow pulses without requiring a high-voltage power supply, extensive input voltage filtering, significant power loss, large size, and/or high cost remains, as yet, unmet in the prior art.

SUMMARY

The present disclosure enables a laser diode or a string of laser diodes to be driven at high-speed with narrow-pulse-width drive signals without some of the costs and disadvantages of the prior art. Embodiments in accordance with the present disclosure employ a low-voltage power supply and inductor, where the inductor is switched between an electrically coupled and decoupled relationship with a charge-storage capacitor that is electrically coupled with a laser-diode string. As a result, the inductor and capacitor are charged and discharged on a pulse-by-pulse basis, which enables low power dissipation for the circuits. Embodiments in accordance with the present disclosure are particularly well-suited for use in optical communications systems, LiDAR systems, laser-range-finding applications, and the like.

Prior-art laser-driver circuits employ power supplies, typically high-voltage, which are configured to statically store energy used to generate drive pulses through a laser-diode string such that the maximum voltage required to drive the laser-diode string is always provided—even though the average power requirement is normally much lower. As a result, such circuits unnecessarily dissipate substantial power at all times.

In contrast to the prior art, embodiments in accordance with the present disclosure store energy on a dynamic basis and, therefore, do not require a continuously operating power supply. Instead, generation and storage of the energy needed for each pulse provided to a laser-diode string is performed on a pulse-by-pulse basis, typically just prior to the generation of each pulse. Such operation is enabled by employing a charge-generation module that includes a low-voltage source and an inductor, where the source charges the inductor only when the circuit is in a first operational state. After the inductor is charged, the circuit is switched to a second operational state in which the charge stored in the inductor is transferred to an output capacitor that is configured to discharge into the laser-diode string when the circuit is subsequently switched into a third operational state in which a circuit path is established that allows the output capacitor to generate a current pulse in the laser-diode string. In some embodiments in accordance with the present disclosure, the first and third operational states of a laser-driver circuit occur simultaneously.

An illustrative embodiment in accordance with the present disclosure includes a charge-generation module and a pulse-generation module. The charge-generation module includes a low-voltage power supply and an inductor, which are electrically connected to ground though a first high-voltage switch. The pulse-generation module includes a capacitor that is electrically couplable with a laser-diode string, where the coupling relationship of the capacitor and the laser-diode string is controlled via a second high-voltage switch.

When the first switch is in its on-state (i.e., closed) and the second switch is in its off-state (i.e., open), a first operational state of the circuit is established in which a first circuit path from the power supply to ground exists through the inductor, which enables the power supply to charge the inductor. Once the inductor is charged, the first switch is opened to establish a second operational state for the circuit in which the first circuit path is made inoperable and a second circuit path that enables the inductor to charge the capacitor is established. Once the capacitor is charged, the second switch is closed, thereby establishing a third operational state in which the second circuit path is made inoperable and a third circuit path that enables the capacitor to generate a current pulse through the laser-diode string is established. The pulse width of the current pulse is based predominantly on the capacitance of the capacitor and the inherent inductance of the laser-diode string.

In some embodiments, the energy stored in the inductor is controlled (e.g., by controlling its charge time, etc.) to control the amount of energy transferred to the capacitor on a pulse-by-pulse basis.

In some embodiments, a single switch is used to control the operational states of the laser-driver circuit. The switch is electrically coupled between a central node and ground, where the central node is located between the inductor and the capacitor. Putting the switch in its on-state simultaneously enables the first and third operational states such that the power supply charges the inductor for a second current pulse while a first current pulse flows through the laser-diode string.

An embodiment in accordance with the present disclosure is a laser-driver circuit for driving a laser-diode string with a current pulse, the laser-diode string including at least one laser diode and being characterized by a first inductance, wherein the laser-driver circuit comprises: a power supply that is configured to provide a first voltage; a first node; an inductor that is electrically coupled between the power supply and the first node, wherein the inductor is configured to store energy provided by the power supply; and a capacitor having a first capacitance; wherein the laser-driver circuit has: (i) a first operational state in which the capacitor is electrically decoupled from the first node such that no current flows from the first node to the capacitor; (ii) a second operational state in which the capacitor is electrically coupled with the first node such that the capacitor receives charge from the first inductor; and (iii) a third operational state in which the capacitor is electrically coupled with the laser-diode string and drives the laser-diode string with the current pulse.

Another embodiment in accordance with the present disclosure is a laser-driver circuit for driving a laser-diode string with a current pulse, the laser-diode string including at least one laser diode and being characterized by a first inductance, wherein the laser-driver circuit comprises: a charge-generation module including a power supply, a first node, an inductor that is electrically coupled between the power supply and the first node, and a first switch that is electrically coupled between the first node and ground, the first switch having a first on-state in which it is conductive and a first off-state in which it is non-conductive; and a pulse-generation module including a second node, a first diode, and a capacitor characterized by a first capacitance and having a first lead and a second lead, the pulse-generation module being electrically coupled with the laser-diode string; wherein the charge-generation module and pulse-generation module are configured to control the energy of the plurality of current pulses on a pulse-by-pulse basis.

Yet another embodiment in accordance with the present disclosure is a method for driving a laser-diode string with a current pulse, the laser-diode string including at least one laser diode and being characterized by a first inductance, wherein the method comprises: charging an inductor by establishing a first circuit path from a power supply to a first potential through the inductor, the power supply being configured to provide a first voltage; enabling the inductor to charge a capacitor by rendering the first circuit path inoperable and establishing a second circuit path from the inductor to the capacitor; and generating the current pulse by rendering the second circuit path inoperable and establishing a third circuit path from the laser-diode string to the first potential through the capacitor.

DETAILED DESCRIPTION

The following terms are defined for use in this Specification, including the appended claims:

Electrically connected is defined as meaning directly connected without intervening elements.

Electrically coupled is defined as being included in the same circuit path. Two elements can be electrically coupled without intervening elements, via an electrically conductive intermediate (e.g., a wire that connects devices, etc.), or via intermediate devices, etc. (e.g., a resistor electrically connected between at least one other electrical device (e.g., a resistor, capacitor, transistor, inductor, etc.).

Electrically decoupled is defined as being arranged such that an electric current does not flow. First and second elements are electrically disconnected if no circuit path exists between them, one element is shorted out by a parallel path such that substantially no current flows through it, and the like.

low-voltage power supply is defined as a power supply configured to generate an output voltage that is less than or equal to 50 volts.

high-voltage power supply is defined as a power supply configured to generate an output voltage that is greater than 50 volts.

Figure 1:
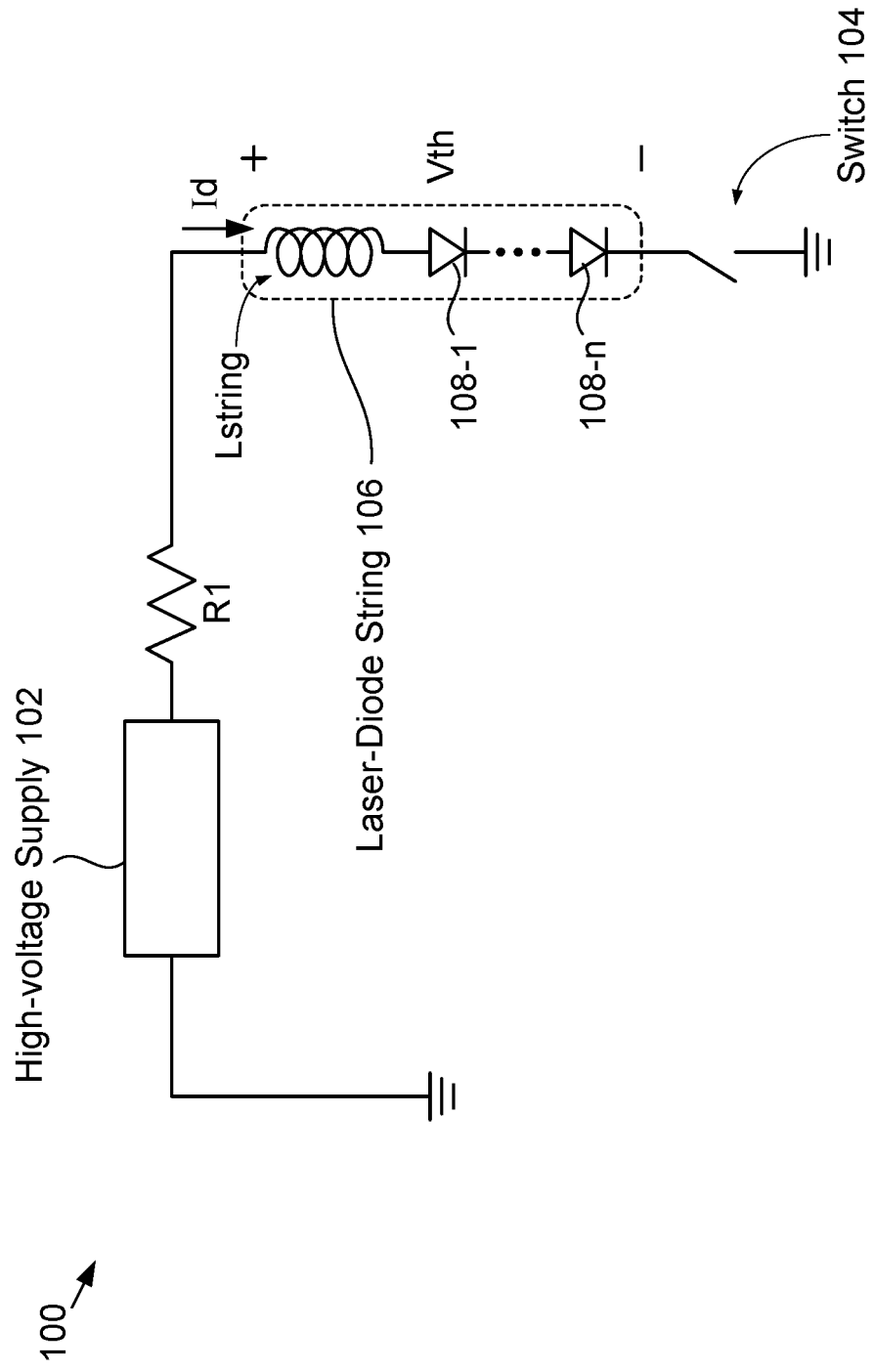
FIG. 1 depicts a schematic drawing of a first example of a laser-driver circuit in accordance with the prior art.

FIG. 1 depicts a schematic drawing of a first example of a laser-driver circuit in accordance with the prior art. Laser-driver circuit 100 includes high-voltage supply 102, limiting resistor R1, and switch 104. Laser-driver circuit 100 is configured to drive laser diode string 106 with a series of current pulses.

Laser-diode string 106 includes laser diodes 108-1 through 108-*n* (referred to, collectively, as laser diodes 108), which are electrically connected in series. Each of laser diodes 108 is characterized by a threshold voltage at which it can emit light, as well as inherent (stray) inductance Lstring, which has a value of Ls. As a result, laser-diode string 106 is collectively characterized by the value of Ls and string threshold voltage Vth.

High-voltage supply 102 is a conventional power supply that provides an output voltage that must be sufficient to satisfy the peak-power requirement of laser-diode string 106 (typically 140 volts or more).

The flow of electric current Id through laser-driver circuit 100 is dictated by switch 104. Typically, switch 104 includes a high-voltage transistor (e.g., a MOSFET, etc.) that is controlled via a gate-driver circuit to close the switch (i.e., put it in its "on-state") and enable current flow through the switch or open the switch (i.e., put it into its "off-state") to disable current flow through the switch.

In operation, switch 104 is sequentially opened and closed to give rise to current Id as a series of current pulses that flow through laser-diode string 106 to generate a series of laser pulses. The pulse width and magnitude of each current pulse is determined by the switch on time, as well as the values of R1 and Ls.

Unfortunately, the parameters of these elements give rise to limit the achievable pulse rate and minimum pulse width that can be realized using laser-driver circuit 100 without employing a supply capable of providing high power. Furthermore, the need for a high-voltage supply leads to a peak-power requirement for laser-driver circuit 100 that is significantly higher than the average power required by laser-diode string 106. In addition, supply 102 typically requires a large storage capacitor, which increases the size and cost of circuit 100, while power loss in resistor R1 can significantly degrade its desirability.

Figure 2:
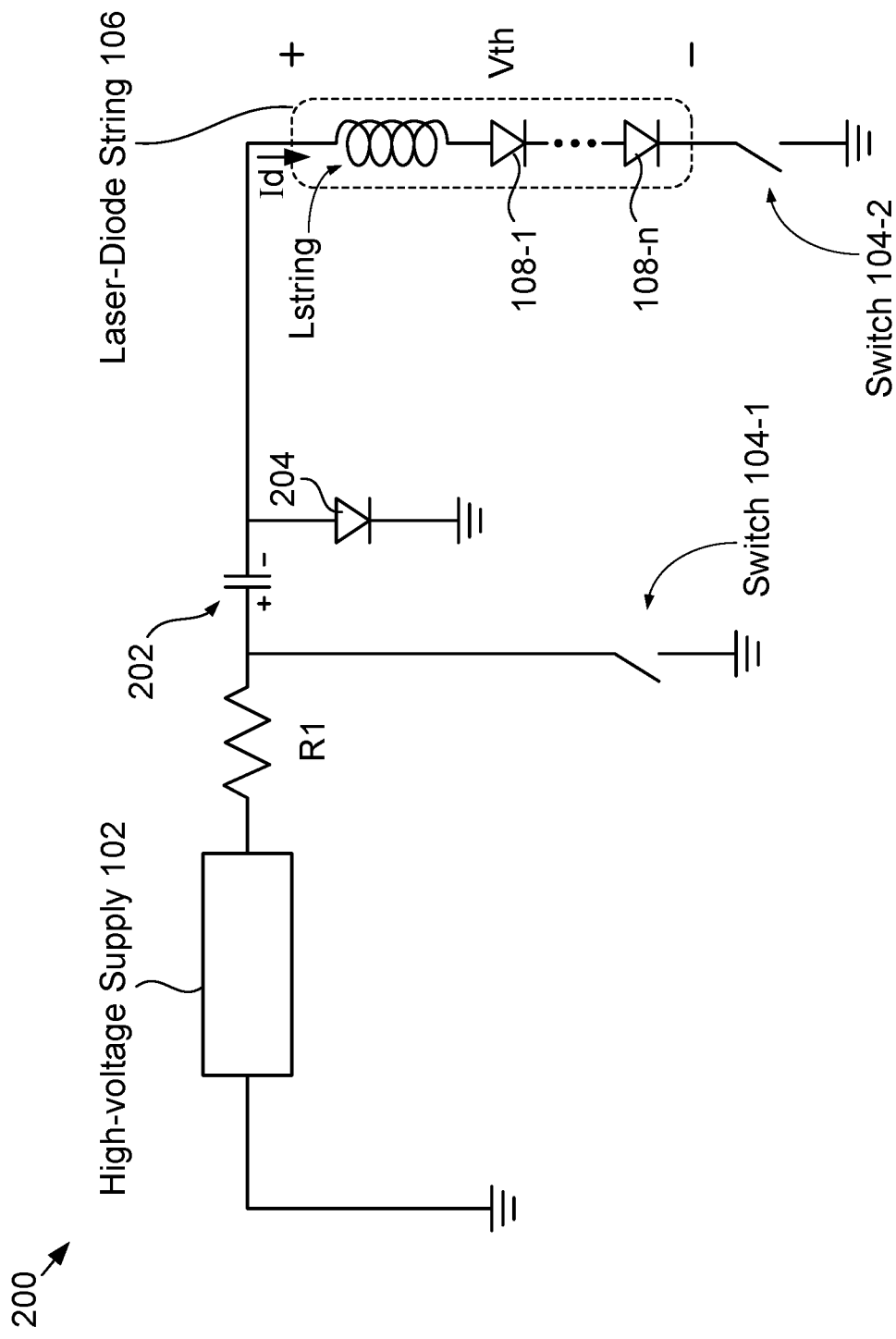
FIG. 2 depicts a schematic drawing of a second example of a laser-driver circuit in accordance with the prior art.

FIG. 2 depicts a schematic drawing of a second example of a laser-driver circuit in accordance with the prior art. Laser-driver circuit 200 includes high-voltage supply 102, switch 104, limiting resistor R1, capacitor 202, and diode 204. Laser-driver circuit 200 is configured to drive laser diode string 106 with a series of current pulses.

Capacitor 202 is a conventional capacitor having capacitance C1, which is selected to enable sufficient charge storage for generating current pulses suitable for driving lasers 108 into emission.

In operation, when switch 104 is in its off-state, high-voltage supply 102 charges capacitor 202 through limiting resistor R1 and diode 204. Once capacitor 202 is fully charged, switch 104 is placed into its on-state (i.e., closed) long enough to discharge capacitor 202, thereby generating current Id as a current pulse through laser-diode string 106. The pulse width of the generated current pulse is determined by the value of C1 and Ls, while the pulse rate is determined by the switching speeds of switches 104-1 and 104-2. Like laser-driver circuit 100, laser-driver circuit 200 typically requires a large storage capacitor, while the need for a high-voltage supply leads to a peak-power requirement for laser-driver circuit 200 that is significantly higher than the average power required by laser-diode string 106.

Figure 3:
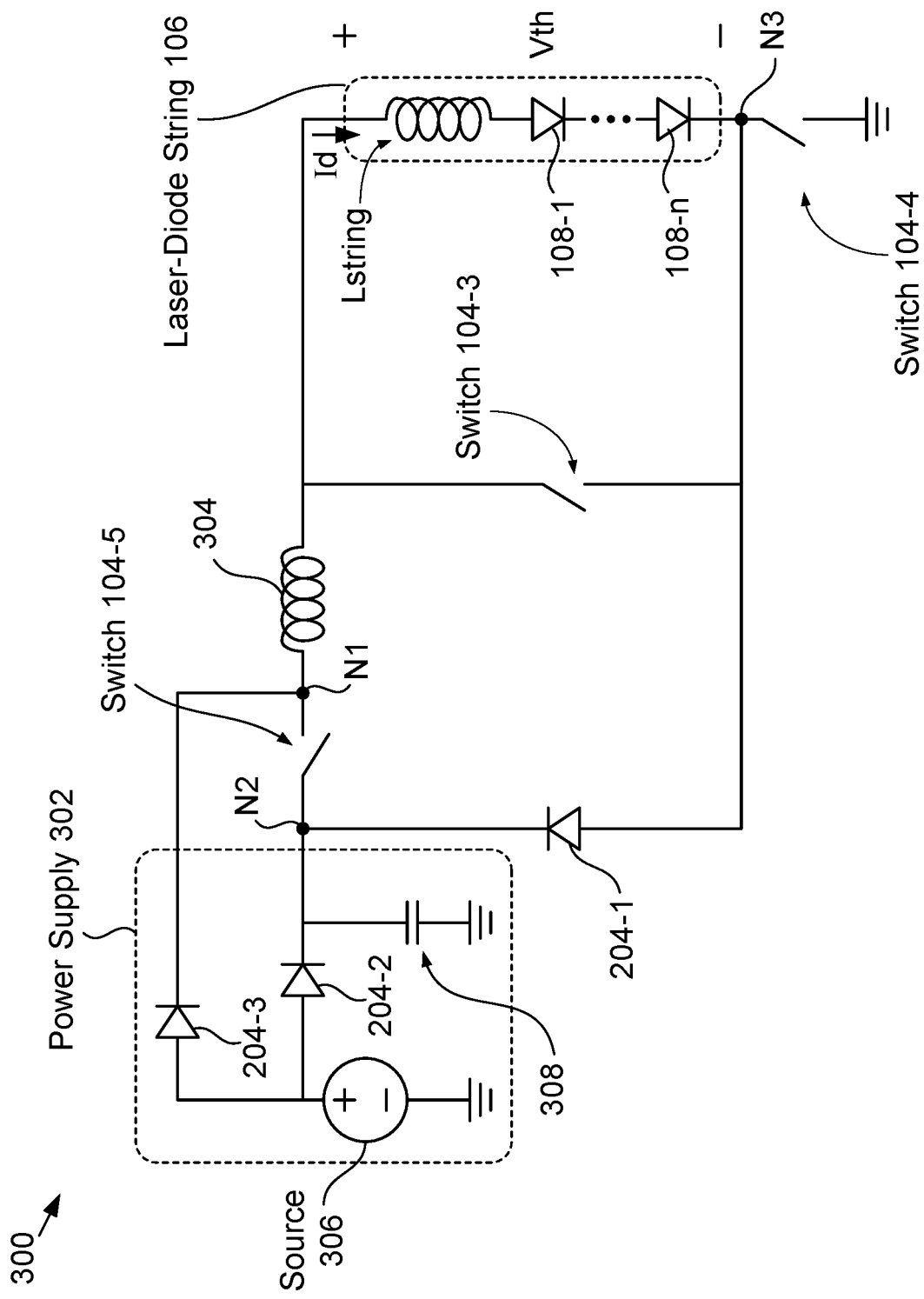
FIG. 3 depicts a schematic drawing of a third example of a laser-driver circuit in accordance with the prior art.

FIG. 3 depicts a schematic drawing of a third example of a laser-driver circuit in accordance with the prior art. Laser-driver circuit 300 includes power supply 302, inductor 304, diode 204-1, and switches 104-3 through 104-5.

Power supply 302 is a power supply that is configured to provide a voltage signal at output node N1. Power supply 302 includes source 306, storage capacitor 308, diodes 204-2 and 204-3, and switch 104-5.

Source 306 is a conventional low-voltage power supply that provides a voltage signal that is less than or equal to threshold voltage Vth.

Source 306 is electrically coupled with storage capacitor 308 through diode 204-3 such that the storage capacitor is charged to a desired output voltage, which is then provided at node N2. The capacitance of storage capacitor 308 is selected to enable laser-driver circuit 300 to provide a current pulse having a substantially flat-top to laser-diode string 106.

Source 306 is also electrically coupled with output node N1 through diode 204-3.

Inductor 304 has inductance L2 and is electrically connected in series between storage capacitor 308 and laser-diode string 106. Typically, inductance L2 is selected such that it is typically much larger than the inductance, Ls, of the inherent (stray) inductance, Lstring, of laser diode string 106.

Switch 104-3 is configured as a "shunt" switch that shorts out laser-diode string 106 when the switch is in its on-state, thereby electrically decoupling the laser diode string from laser-driver circuit 300 and disabling the flow of current Id.

Diode 204-1 is configured across the series combination of inductor 304 and laser-diode string 106 such that current flow is selectively enabled from node N3 to node N2 when switches 104-3 and 104-4 are in their off-states.

In operation, switches 104-3 and 104-4 are initially in their on-states, thereby shorting out laser-diode string 106 and connecting inductor 304 between output node N1 and ground, which enables current to build up in the inductor.

When the current in inductor 304 reaches a desired level, switch 104-3 is opened (i.e., put into its off-state) and the voltage across laser-diode string 106 rapidly increases, thereby generating current Id through the laser-diode string as a current pulse having a short rise time.

After a desired time (i.e., the desired pulse width), switch 104-3 is put into its on-state and the current flow through the laser-diode string stops.

Stored energy remaining in inductor 304 after switch 104-3 is closed is then returned to power supply 302 by opening switches 104-4 and 104-5, while switch 104-3 remains closed. As a result, the remaining stored energy flows into capacitor 308 via a circuit that includes the inductor, switch 104-3, and diode 204-1, thereby increasing the voltage across the capacitor. Power supply 302 is enabled, therefore, to provide an output voltage at output node N1 that exceeds the voltage provided by source 306.

It should be noted that capacitor 308 is always electrically coupled with source 306 in laser-driver circuit 300. Furthermore, the pulse width of current pulses provided to laser-diode string 106 is determined by the time between the opening and closing of switch 104-1. Still further, the drive to switches 104-3 and 104-5 must be isolated from ground, which adds complexity, cost, and time delay to circuit 300.

In contrast to prior-art laser-driver circuits, circuits in accordance with the present disclosure do not require a continuously operating, high-voltage power supply because they do not store energy in static fashion. Each circuit in accordance with the present disclosure includes a switch that enables a first circuit path in which an inductor is charged from a voltage source (i.e., power supply) while the switch is closed. When the switch is subsequently opened, the first circuit path is disabled and a second circuit path is established in which the inductor discharges into an output capacitor that is electrically coupled with a laser-diode string. Once the output capacitor is charged, a third circuit path is established to enable the capacitor to discharge into the laser-diode string thereby generating a current pulse through the laser diodes. In other words, rather than keeping the output capacitor charged at all times, the capacitor is only briefly charged to a high voltage then quickly discharged into the laser-diode string to generate a current pulse.

The charge/discharge cycle for the capacitor is repeated for each current pulse, which enables the amount of energy provided to the laser-diode string to be controlled on a pulse-by-pulse basis by controlling the energy stored in the inductor in each cycle (e.g., by varying its charging time, etc.).

Embodiments in accordance with the present disclosure have several advantages over prior-art laser-driver circuits, including:

i. a continuously operating high-voltage power supply is not required; or
 ii. smooth input current, which reduces the need for input-voltage filtering; or
 iii. fewer components; or
 iv. smaller size; or
 v. higher efficiency; or
 vi. lower cost; or
 vii. pulse-by-pulse control of the energy of the generated current pulse; or
 viii. any combination of i, ii, iii, iv, v, vi, and vii.

Furthermore, some embodiments of the present invention enable pulse-by-pulse amplitude variation by adjusting the gate drive waveform(s).

Figure 4:
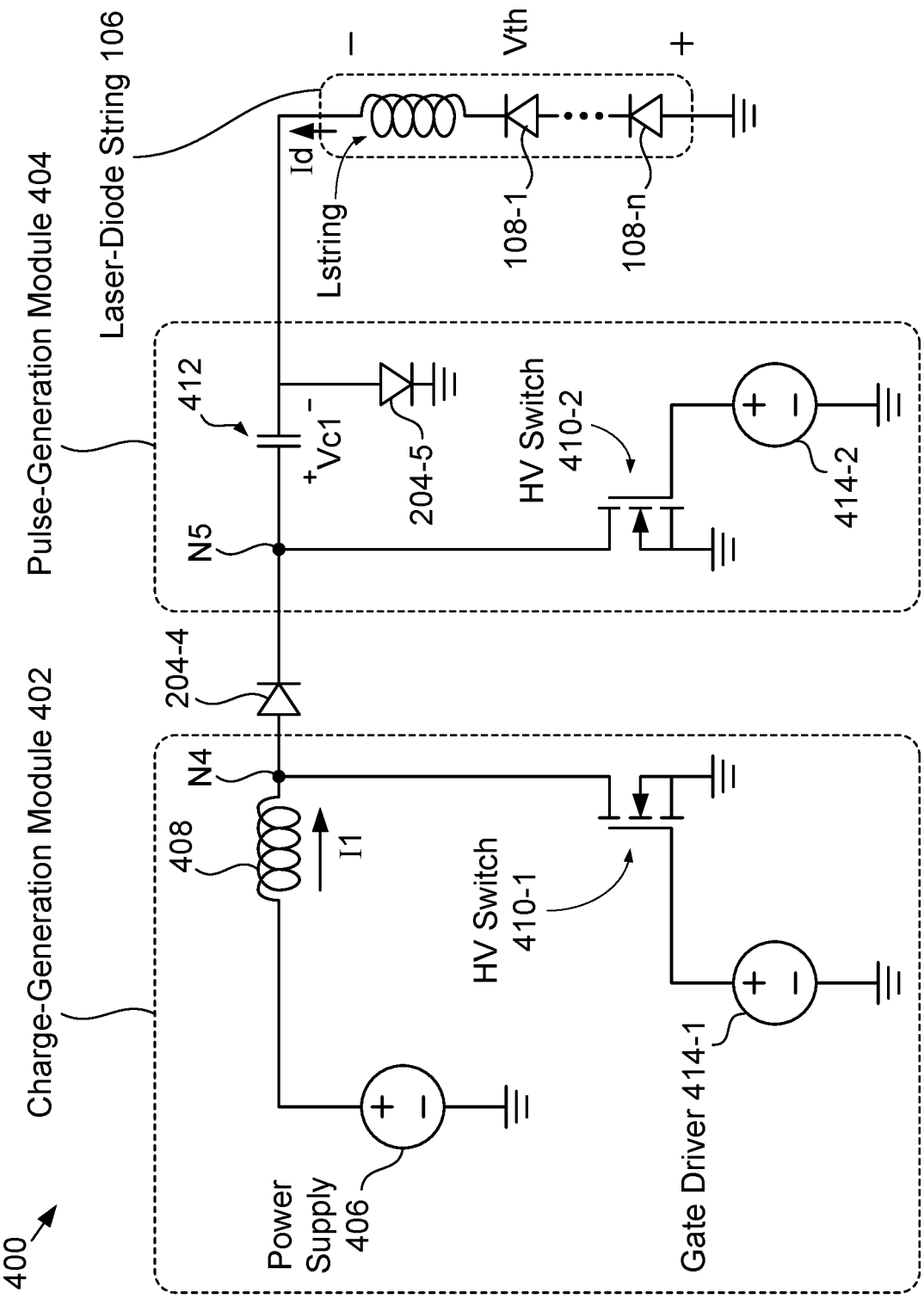
FIG. 4 depicts a schematic drawing of an illustrative embodiment of a laser-driver circuit in accordance with the present invention.

FIG. 4 depicts a schematic drawing of an illustrative embodiment of a laser-driver circuit in accordance with the present invention. Laser-driver circuit 400 includes charge-generation module 402, pulse-generation module 404, and diode 204-4. Laser-driver circuit 400 is configured to produce one or a series of short-pulse-width (e.g., nanosecond-scale) current pulses in laser-diode string 106.

Charge-generation module 402 includes power supply 406, inductor 408, and high-voltage (HV) switch 410-1.

Power supply 406 is a voltage source that is configured to provide an output voltage of up to 50 volts; however, power supply 406 can supply other voltages without departing from the scope of the present disclosure. In the depicted example, power supply 406 is a conventional car battery, which provides a voltage that is approximately 12 volts (although the voltage provided by a car battery can vary within the range of 10 volts to 15 volts).

Inductor 408 is a conventional inductor having an inductance, Lcharge, which is typically selected based on the desired pulse rate and output voltage for laser-driver circuit 400; however, myriad values of Lcharge can be used without departing from the scope of the present disclosure. In the depicted example, Lcharge has a value of approximately 3.3 µH. Inductor 408 is electrically coupled with power supply 406 such that, when HV switch 410-1 is closed, current can flow from the source to ground through inductor 408.

It should be noted that, although the components included in laser-driver circuit 400 are referenced to ground, any suitable reference potential can be used without departing from the scope of the present disclosure.

HV switch 410-1 is a conventional transistor-based switch, such as an enhancement-mode power transistor. The gate of HV switch 410-1 is driven by gate driver 414-1, which is a conventional, high-speed gate driver. In the depicted example, HV switch 410-1 is an EPC2010C transistor chip and gate driver 414-1 is an LMG1020 low-side gate-driver chip; however, myriad alternatives can be used for one or both of HV switch 410-1 and gate driver 414-1 without departing from the scope of the present disclosure.

Pulse-generation module 404 includes capacitor 412, diode 204-5, and HV switch 410-2.

Capacitor 412 is a conventional capacitor having capacitance Cpulse. Capacitor 412 is configured to receive and store charge provided by charge-generation module 402. Since the pulse width of a current pulse generated in laser-diode string 106 is based on the values of Cpulse and Lstring, the value of Cpulse is selected to realize a desired pulse width, which is typically less than or equal to 100 ns. In the depicted example, Cpulse is approximately 1 nF and the pulse width is approximately 20 ns; however, other values of Cpulse can be used without departing from the scope of the present disclosure.

HV switch 410-2 is analogous to HV switch 410-1 described above.

Diode 204-4 is electrically connected between charge-generation module 402 and pulse-generation module 404. The inclusion of diode 204-4 inhibits current flow from the pulse-generation module to the charge-generation module.

Figure 5:
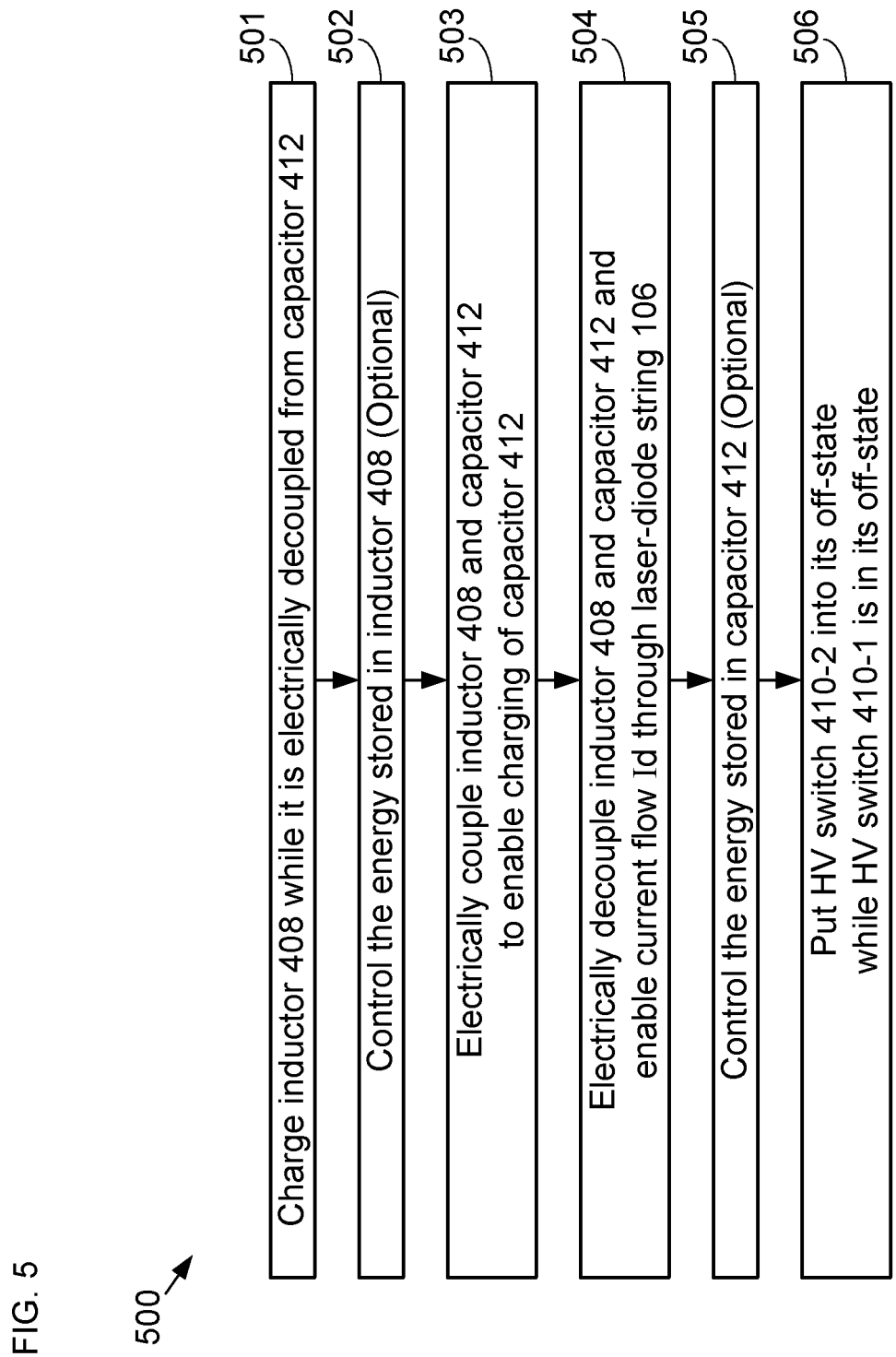
FIG. 5 depicts operations of a method for generating a current pulse in a laser-diode string in accordance with the illustrative embodiment.

FIG. 5 depicts operations of a method for generating a current pulse in a laser-diode string in accordance with the illustrative embodiment.

Figure 6:
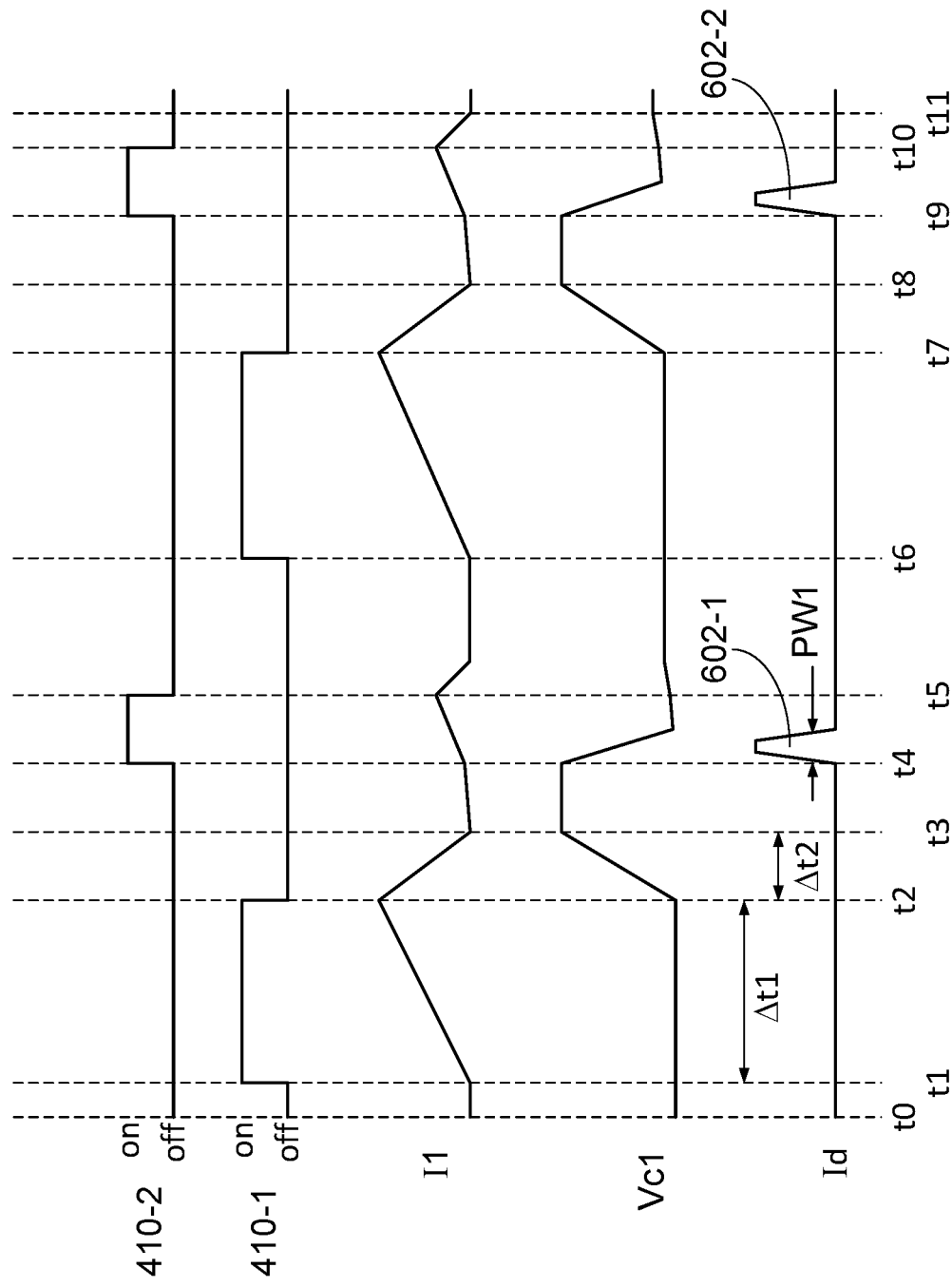
FIG. 6 depicts a timing diagram for the operation of laser-driver circuit 400 in accordance with the illustrative embodiment.

FIG. 6 depicts a timing diagram for the operation of laser-driver circuit 400 in accordance with the illustrative embodiment. Timing diagram 600 shows two current pulses generated via repeated performance of method 500. Method 500 is described herein with reference to FIGS. 4 and 6.

Method 500 begins with operation 501, wherein gate driver 414-1 puts HV switch 410-1 into its on-state (i.e., closed) at time t1 while HV switch 410-2 is in its off state.

The closure of HV switch 410-1 puts laser-diode circuit 400 into a first operational state in which a first circuit path exists from power supply 406 to ground through inductor 408, node N4, and HV switch 410-1. In this state, power supply 406 charges inductor 408 and pulse-generation module 404 is shorted out and, therefore, electrically decoupled from charge-generation module 402, disabling current flow from inductor 408 to capacitor 412.

At optional operation 502, the energy of the current pulse to be provided to laser-diode string 106 is controlled by controlling the charging of time, $\Delta t1$, for inductor 408, which controls the amount of energy stored by the inductor.

At operation 503, at time t2 (where t2 is equal to t1+$\Delta t1$), HV switch 410-1 is put into its off-state by gate driver 414-1. With both HV switches 410-1 and 410-2 in their off-states, laser-driver circuit 400 is put into a second operational state in which a second circuit path is established from source 406 to ground, through inductor 408, diode 204-4, capacitor 412, and diode 204-5, thereby enabling inductor 408 to charge capacitor 412. As a result, voltage Vc1 increases until the capacitor is fully charged at time t3.

At optional operation 504, the energy of the current pulse to be provided to laser-diode string 106 is controlled by controlling the energy stored in capacitor 412. In some embodiments, the energy stored in capacitor 412 is controlled by controlling the capacitance of capacitor 412. In such embodiments, capacitor 412 is a variable capacitor whose capacitance can be changed at a rate suitable for the repetition rate required for laser-driver circuit 400. In some embodiments, the energy stored in capacitor 412 is controlled by controlling the time period, $\Delta t2$, over which inductor 408 is allowed to charge capacitor 412 such that the capacitor is not fully charged at time t3.

At operation 505, at time t4, HV switch 410-2 is put into its on-state by gate driver 414-2. This puts laser-driver circuit 400 into a third operational state in which a third circuit path to ground through capacitor 412 and laser-diode string 106 is established. The third circuit path enables the flow of current Id through laser-diode string 106 to generate current pulse 602-1. As current Id flows, the magnitude of voltage Vc1 decreases at a rate that is a function of the values of C1 and Lstring.

When the magnitude of voltage Vc1 drops below a critical voltage (e.g., threshold voltage Vth), the flow of current Id stops. The duration of current pulse 602-1 is denoted as PW1, which is predominantly based on the values of C1 and Lstring.

At operation 506, at time t5, which is after the flow of current Id ceases, HV switch 410-2 is put into its off-state to render the third circuit path inoperable (i.e., to break the circuit path).

As depicted in timing diagram 600 method 500 is repeated, beginning at time t6, to generate a second current pulse—namely, current pulse 602-2. It should be noted that operations 501 through 506 can be repeated as many times as desired to generate a series of current pulses of any desired length. Furthermore, by controlling the time over which inductor 408 is charged in each cycle of method 500 in optional operation 502, the amount of energy provided to laser-diode string 106 is controlled on a pulse-by-pulse basis.

Figure 7:
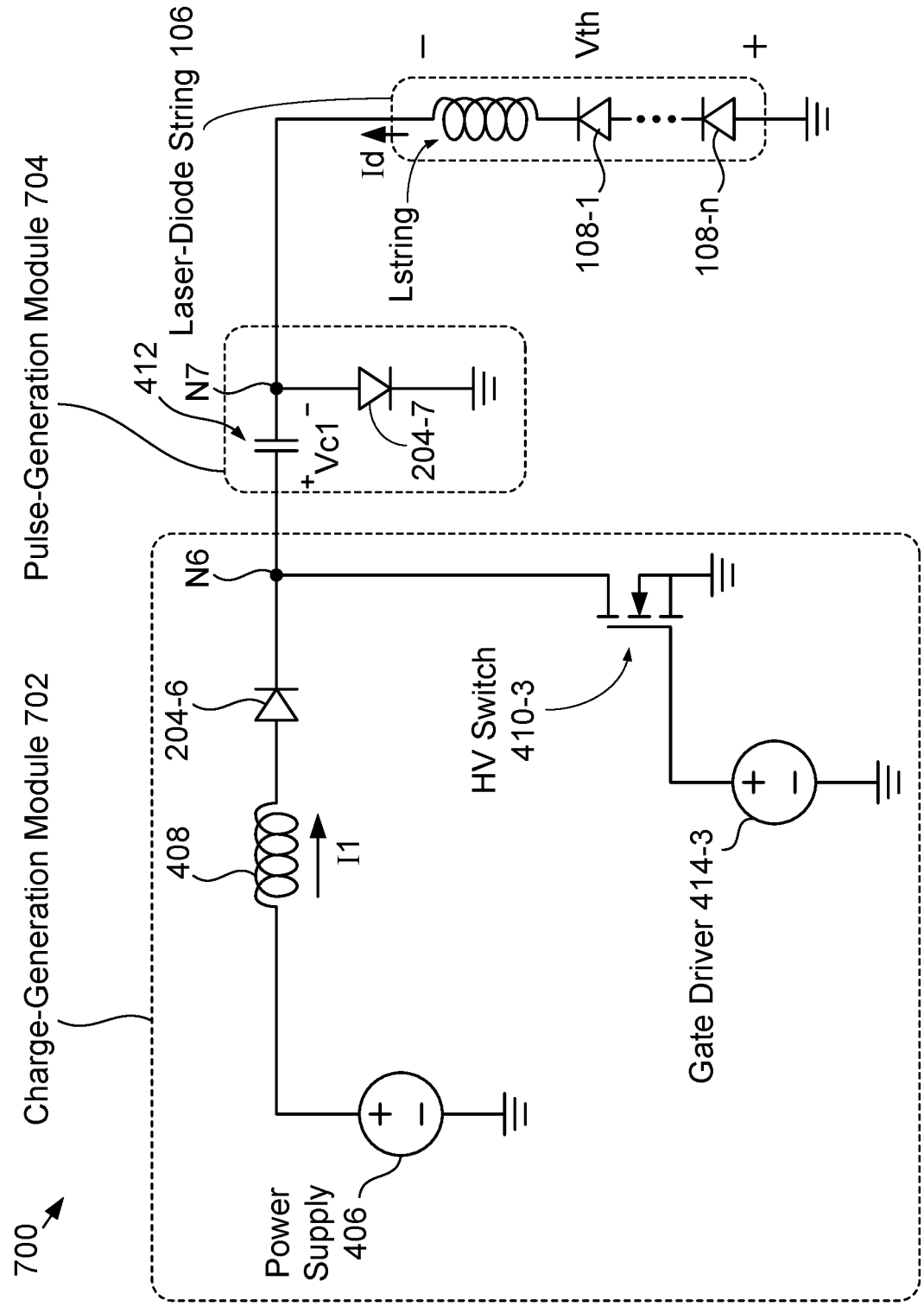
FIG. 7 depicts a schematic drawing of a second exemplary laser-driver circuit in accordance with the present disclosure.

FIG. 7 depicts a schematic drawing of a second exemplary laser-driver circuit in accordance with the present disclosure. Laser-driver circuit 700 includes charge-generation module 702 and pulse-generation module 704, which are connected at node N6.

Charge-generation module 702 includes power supply 406, inductor 408, diode 204-6, HV Switch 410-3, gate driver 414-3.

Pulse-generation module 704 includes capacitor 412 and diode 204-7, which are electrically coupled with laser-diode string 106 at node N7.

Figure 8:
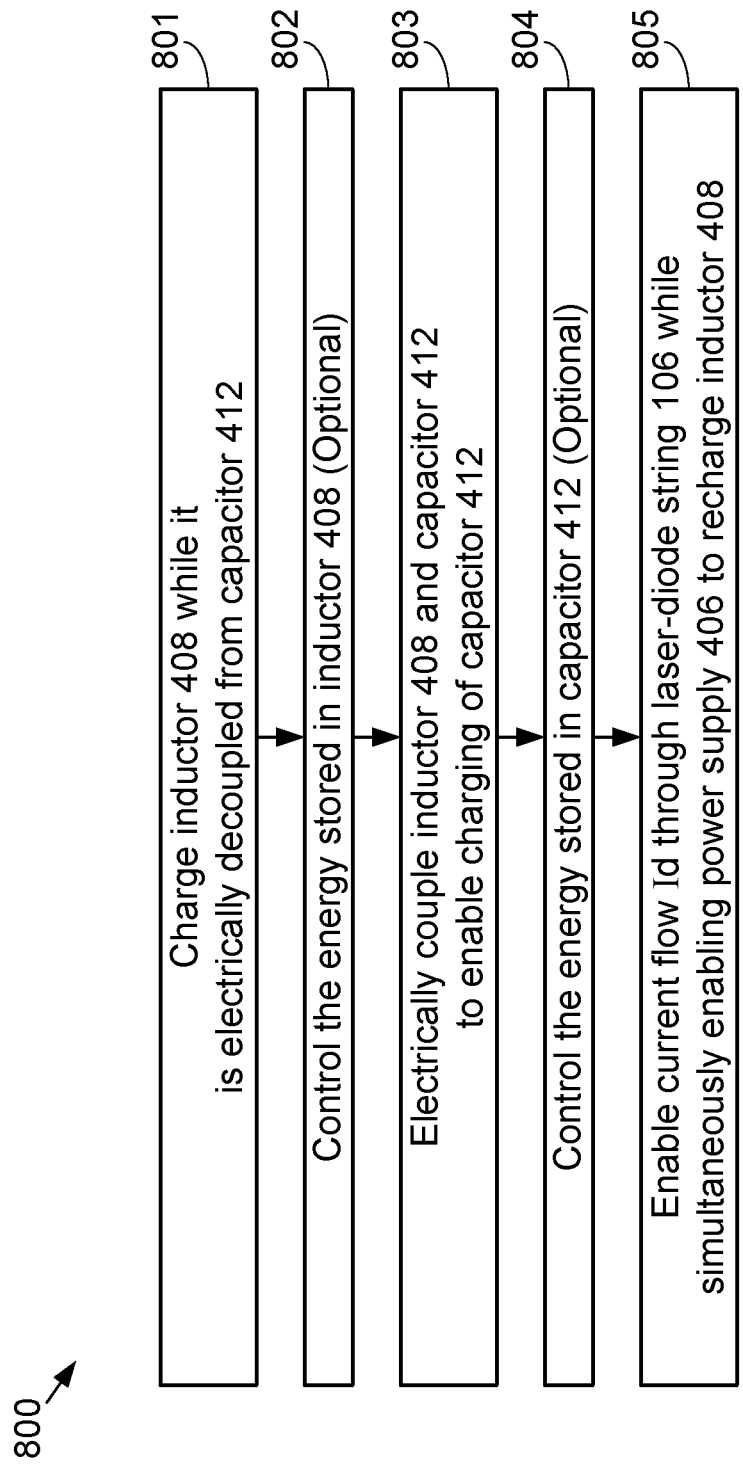
FIG. 8 depicts operations of a method for generating a current pulse in a laser-diode string in accordance with second exemplary embodiment.

FIG. 8 depicts operations of a method for driving a laser-diode string with a current pulse in accordance with the second exemplary laser-driver circuit.

Figure 9:
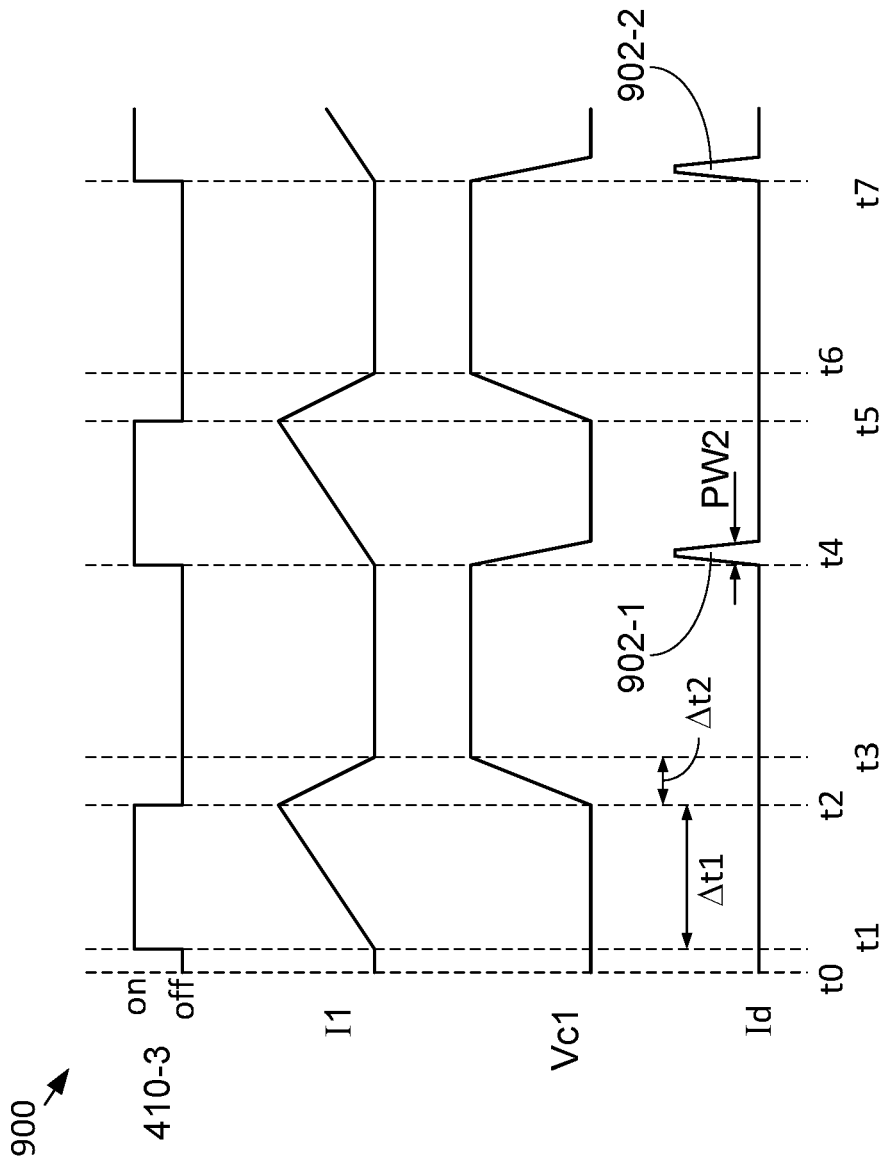
FIG. 9 depicts a timing diagram for the operation of laser-driver circuit 700.

FIG. 9 depicts a timing diagram for the operation of laser-driver circuit 700. Timing diagram 900 shows two current pulses generated via repeated performance of method 800. Method 800 is described herein with reference to FIGS. 7 and 9.

Method 800 begins with operation 801, wherein HV switch 410-3 is put into its on-state. While HV switch 410-3 is in its on-state, inductor 408 and capacitor 412 are electrically decoupled, since node N6 is electrically connected to ground, thereby shorting out the series combination of capacitor 412 and laser-diode string 106.

The closure of HV switch 410-3 puts laser-diode circuit 700 into a first operational state in which a first circuit path exists from power supply 406 to ground through inductor 408, diode 204-6, node N6, and HV switch 410-3. As a result, the charging of inductor 408 by power supply 406 is enabled while current flow from inductor 408 to capacitor 412 is disabled.

At optional operation 802, the energy of the current pulse to be provided to laser-diode string 106 is controlled by controlling the charging of time, Δt1, for inductor 408, which controls the amount of energy stored by the inductor.

At operation 803, at time t2, HV switch 410-3 is put into its off-state by gate driver 414-3. As a result, laser-driver circuit 700 is put into a second operational state in which the first circuit path is broken and a second circuit path is established from inductor 408 to ground, through capacitor 412, node N7, and diode 204-7, such that inductor 408 can charge capacitor 412. As the capacitor charges, voltage Vc1 increases until the capacitor is fully charged at time t3.

At optional operation 804, the energy of the current pulse to be provided to laser-diode string 106 is controlled by controlling the energy stored in capacitor 412. In some embodiments, the energy stored in capacitor 412 is controlled by controlling the capacitance of capacitor 412. In such embodiments, capacitor 412 is a variable capacitor whose capacitance can be changed at a rate suitable for the repetition rate required for laser-driver circuit 400. In some embodiments, the energy stored in capacitor 412 is controlled by controlling the time period, Δt2, over which inductor 408 is allowed to charge capacitor 412 such that the capacitor is not fully charged at time t3.

At operation 805, at time t4, HV switch 410-3 is again put into its on-state by gate driver 414-3. This puts laser-driver circuit 400 into a third operational state in which the second circuit path is disabled and a third circuit path is established to enable the flow of current Id from laser-diode string 106 to ground through node N7, capacitor 412, node N6, and HV switch 410-3, thereby generating current pulse 902-1. As current Id flows, the magnitude of voltage Vc1 decreases at a rate that is a function of the values of C1 and Lstring.

When the magnitude of voltage Vc1 drops below a critical voltage (e.g., the threshold voltage Vth), the flow of current Id stops. The duration of current pulse 902-1 is denoted as PW2, which is based on the values of C1 and Lstring.

It should be noted that, in the third operational state of laser-driver circuit 700, current I1 is again enabled through inductor 408, since HV switch 410-3 is in its on-state, re-establishing the first circuit path from power supply 406 to ground through inductor 408, diode 204-6, and HV switch 410-3. In other words, the third operational state of laser-driver circuit 700 is analogous to a combination of the first and third operational states of laser-driver circuit 400. As a result, in the third operational state of laser-driver circuit 700, power supply 406 simultaneously charges inductor 408 while current flow Id through laser-diode string 106 is enabled.

By repeating method 900, therefore, second current pulse 902-2 can be generated at time t7, as indicated in timing diagram 900. It should be noted that operations 801 through 805 can be repeated as many times as desired to generate a series of current pulses of any desired length.

It is to be understood that the disclosure teaches just some examples of embodiments in accordance with the present invention and that many variations of the invention can easily be devised by those skilled in the art after reading this disclosure and that the scope of the present invention is to be determined by the following claims.

What is claimed is:

1. A laser-driver circuit for driving a laser-diode string with a current pulse, the laser-diode string including at least one laser diode and being characterized by a first inductance, wherein the laser-driver circuit comprises: a power supply (406) that is configured to provide a first voltage; a first node (N4); an inductor (408) that is electrically coupled between the power supply and the first node, wherein the inductor is configured to store energy provided by the power supply; a first switch (410-1) that is electrically coupled between the first node and a first reference potential, wherein the first switch has a first off-state in which it is non-conductive and a first on-state in which it is conductive, and wherein the first switch is driven by a first Gate driver (414-1); a capacitor (412) having a first capacitance, the capacitor being electrically coupled in series between a second node (N5) and the laser-diode string; a second switch (410-2) that is electrically coupled between the second node and the first reference potential, wherein the second switch has a second off-state in which it is non-conductive and a second on-state in which it is conductive, and wherein the second switch is driven by a second gate driver (414-2); a first diode that is electrically coupled between the first node and a second node (N5), wherein the first diode is configured to inhibit current flow from the second node to the first node; and a second diode that is electrically coupled between the capacitor and the first reference potential, wherein the second diode and the laser-diode string are electrically coupled in parallel; wherein, when the first switch is in the first on-state, (1) a first circuit path from the power supply to the first reference potential is established through the inductor to enable the power supply to charge the inductor and (2) the capacitor is electrically decoupled from the first node such that no current flows from the first node to the capacitor; wherein, when the first switch is in the first off-state and the second switch is in the second off-state, a second circuit path from the inductor to the first reference potential is established through the capacitor and the second diode to enable the inductor to charge the capacitor; and wherein, when the second switch is in the second on-state, a third circuit path from the laser-diode string to the first reference potential through the capacitor to enable the capacitor to drive the laser-diode string with the current pulse, wherein the first and second gate drivers are independent of one another.

2. The laser-driver circuit of claim 1 wherein, when the second switch is in the second on-state, substantially no current flows from the first node to the capacitor.

3. The laser-driver circuit of claim 1 wherein the laser-diode string includes a plurality of laser diodes.

4. The laser-driver circuit of claim 1 wherein the first reference potential is ground.

5. A laser-driver circuit for driving a laser-diode string with a plurality of current pulses, the laser-diode string including at least one laser diode and being characterized by a first inductance, wherein the laser-driver circuit comprises: a charge-generation module including a power supply, a first node, an inductor that is electrically coupled between the power supply and the first node, and a first switch that is electrically coupled between the first node and ground, the first switch having a first on-state in which it is conductive and a first off-state in which it is non-conductive, wherein the first switch is driven by a first gate driver; a pulse-generation module including a second node, a first diode, a capacitor characterized by a first capacitance, and a second switch having a second off-state in which it is non-conductive and a second on-state in which it is conductive, wherein the second switch is driven by a second gate driver, the pulse-generation module being electrically coupled with the laser-diode string such that the capacitor and the laser-diode string are electrically coupled in series; and a second diode that is electrically coupled between the first node and second node, wherein the second diode is configured to inhibit current flow from the second node to the first node; wherein the laser-driver circuit has: (i) a first operational state that includes a first circuit path from the power supply to ground through the inductor, the first node, and the first switch when the first switch is in the first on-state, wherein the first operational state enables the power supply to charge the inductor and inhibits current flow from the inductor to the capacitor; (ii) a second operational state that includes a second circuit path from the power supply to ground through the inductor, the first node, the second node, the capacitor, and the first diode when the first switch is in the first off-state, the second operational state enabling the inductor to charge the capacitor; and (iii) a third operational state that includes a third circuit path from the laser-diode string to ground through the capacitor, the second switch, and the second node, the third circuit path enabling a first current pulse of the plurality thereof to flow through the laser-diode string; wherein the charge-generation module and pulse-generation module are configured to control the energy of the plurality of current pulses on a pulse-by-pulse basis, and wherein the first and second gate drivers are independent of one another.

6. The laser-driver circuit of claim 5 wherein the third operational state further includes the first circuit path.

7. The laser-driver circuit of claim 5 wherein the pulse width of the first current pulse is less than or equal to 100 nanoseconds.

8. The laser-driver circuit of claim 5 wherein the pulse width of the first current pulse is less than or equal to 20 nanoseconds.

9. A method for driving a laser-diode string with a plurality of current pulses, the laser-diode string including at least one laser diode and being characterized by a first inductance, wherein the method comprises: charging an inductor by establishing a first circuit path from a power supply to a first reference potential through the inductor and a first node that is between the inductor and a first switch that is driven by a first gate driver, the power supply being configured to provide a first voltage; enabling the inductor to charge a capacitor that is electrically coupled in series between the inductor and the laser-diode string by rendering the first circuit path inoperable and establishing a second circuit path from the inductor to the first reference potential through the capacitor and a first diode that is electrically coupled in series between the capacitor and the first reference potential and is electrically in parallel with the laser-diode string, the second circuit path including a second diode that is configured to inhibit current flow from the capacitor to the first node; and generating a first current pulse of the plurality thereof by rendering the second circuit path inoperable and establishing a third circuit path from the laser-diode string to the first reference potential through the capacitor, a second node, and a second switch that is driven by a second gate driver, wherein the first and second gate drivers are independent of one another.

10. The method of claim 9 wherein the first circuit path is established by putting the first switch into a first on-state in which it is conductive.

11. The method of claim 9 wherein the second circuit path is established by putting the first switch into a first off-state in which it is non-conductive and putting the second switch in a second off-state in which it is non-conductive.

12. The method of claim 9 wherein the third circuit path is established by putting the second switch into a second on-state in which it is conductive.

13. The method of claim 9 further comprising providing the power supply such that the first voltage is less than or equal to 15 volts.

14. The method of claim 9 wherein the first reference potential is ground.

15. The method of claim 9 further comprising controlling the energy of the first current pulse.

* * * * *